United States Patent [19]
Brouquet

[11] Patent Number: 5,786,039
[45] Date of Patent: *Jul. 28, 1998

[54] PROCESS FOR ELECTRICAL INSULATION IN MICROELECTRONICS, APPLICABLE IN NARROW CAVITIES, BY DEPOSITION OF OXIDE IN THE VISCOUS STATE AND CORRESPONDING DEVICE

[75] Inventor: Pierre Brouquet, Crolles, France

[73] Assignee: France Telecom, France

[*] Notice: This patent issued on a continued prosecution application filed under 37 CFR 1.53(d), and is subject to the twenty year patent term provisions of 35 U.S.C. 154(a)(2).

[21] Appl. No.: 645,983

[22] Filed: May 14, 1996

[30] Foreign Application Priority Data

May 15, 1995 [FR] France .................. 95 05710

[51] Int. Cl.$^6$ .................................................. H05H 1/24
[52] U.S. Cl. .................. 427/578; 427/579; 427/588; 427/376.2; 427/419.3
[58] Field of Search .......................... 427/578, 579, 427/588, 376.2, 419.3

[56] References Cited

U.S. PATENT DOCUMENTS

| | | | |
|---|---|---|---|
| 3,804,639 | 4/1974 | Trulsson et al. | 106/1 |
| 4,678,835 | 7/1987 | Chang et al. | 525/100 |
| 4,885,259 | 12/1989 | Osinski et al. | 437/41 |
| 4,954,459 | 9/1990 | Avanzino et al. | 437/228 |
| 5,244,827 | 9/1993 | Dixit et al. | 437/70 |
| 5,314,724 | 5/1994 | Tsukune et al. | 427/489 |
| 5,324,690 | 6/1994 | Gelatos et al. | 437/236 |
| 5,360,646 | 11/1994 | Morita | 427/574 |
| 5,440,166 | 8/1995 | Dixit et al. | 257/506 |
| 5,470,772 | 11/1995 | Woo | 437/43 |

FOREIGN PATENT DOCUMENTS

| | | | |
|---|---|---|---|
| 0519079 | 12/1992 | European Pat. Off. | H01L 21/312 |
| 540277 | 5/1993 | European Pat. Off. | H01L 21/00 |
| 9401885 | 1/1994 | WIPO . | |

OTHER PUBLICATIONS

G. Smolinksy et al., "Material Properties of Spin-on Silicon oxide (SOX) for Fully Recessed NMOS Field Isolation," J. Electrochem. Soc. vol. 137, No. 1, Jan. 1990 pp. 229–234.

Dobson et al., "Advanced $SiO_2$ Planarization Using Silicone and $H_2O_2$," Semiconductor International, Dec. 1994, pp. 85–88.

Primary Examiner—Benjamin Utech

[57] ABSTRACT

The invention relates to a process for electrical insulation of conductive or semiconductor materials of a substrate, characterized in that it comprises at least the following steps:

(a) at least one so-called conformal layer of insulating oxide is deposited on the predetermined regions of the substrate to be insulated;

(b) a layer of planarizing oxide precursor is deposited on the predetermined regions by chemical reaction in plasma phase of a tetraalkylsilicate and of hydrogen peroxide;

(c) at least one layer of insulating oxide is deposited on the predetermined regions; and (d) a conversion annealing operation is carried out.

It also relates to the semiconductor devices and integrated-circuit elements having insulated narrow cavities.

10 Claims, 2 Drawing Sheets

PROCESS FOR ELECTRICAL INSULATION IN MICROELECTRONICS, APPLICABLE IN NARROW CAVITIES, BY DEPOSITION OF OXIDE IN THE VISCOUS STATE AND CORRESPONDING DEVICE

The invention relates to a process which makes it possible to produce the electrical insulation of conductive or semiconductor materials, used in micro-electronics and having narrow cavities, by deposition of oxide in the viscous state, as well as to devices which include such cavities.

The techniques of insulating conductive materials, for example metals used for interconnections, especially in integrated circuits, or semiconductor materials for the active areas of a semiconductor substrate, continue to evolve within the framework of reducing the size of integrated circuits or semiconductor circuits and of increasing the density within the micro-electronics field.

Vapour deposition techniques, using chemical reactions in a vapour phase (CVD) or in a plasma phase (PECVD), are already known, these being used especially for insulation, in micro-electronics, produced from silicon oxide. The techniques mentioned hereinabove all employ chemical reactions using silicon-based compounds, such as silane, tetraethyl orthosilicate or dichlorosilane, as well as oxidising agents ($O_2$, $N_2O$ and $O_3$). All these reactions produce an SiO radical responsible for forming silicon oxide. The unsaturated oxygen of the SiO radical is extremely reactive; the chemical bond created immediately upon the arrival at the surface of an SiO radical is very strong and the deposition occurs without any surface mobility because of the three-dimensional crosslinking.

All the depositions produced, usually based on SiO, are called conformal, that is to say that they are formed so as to be parallel to the surfaces on which they are deposited.

When the patterns to be covered are closely spaced, the depletion, by shadowing effect, of the flux of SiO radicals prevents the formation of the oxide in the narrow cavities.

The object of the invention is to propose a process for depositing oxide in the viscous state which makes it possible to fill these narrow cavities.

The process of the invention makes it possible to fill narrow cavities and to planarize the surfaces covered with oxide which, after annealing, has properties similar to those of silicon oxides $SiO_2$ deposited using the conventional methods.

The invention thus relates to a process for electrical insulation of conductive or semiconductor materials of a substrate, which comprises at least the following steps:

(a) at least one so-called conformal layer of insulating oxide is deposited on the predetermined regions of the substrate to be insulated;

(b) a layer of planarizing oxide precursor is deposited on the predetermined regions by chemical reaction in plasma phase of a tetraalkylsilicate and of hydrogen peroxide;

(c) at least one layer of insulating oxide is deposited on the predetermined regions; and (d) a conversion annealing operation is carried out.

According to the invention, substrate is understood to mean the conductive or semiconductor materials the electrical insulation of which it is desired to produce, at least in predetermined regions. These may be, especially, the metals used for the interconnections or the semiconducting active areas of semiconductors.

The process according to the invention applies particularly to regions having narrow cavities, for lateral insulation by trenches of the semiconductor substrate or inter-metal insulation for connection levels.

Narrow cavities are understood to mean all patterns for which the usual depositions are likely to cause shadowing effects.

Thus, according to the invention, the hydrogen peroxide used is decomposed in plasma phase in order to generate a hydroxyl radical OH. When the gaseous silicon compound, that is the tetraalkylsilicate or tetraalkyl orthosilicate, is brought into contact with OH in plasma phase or in CVD phase, it oxidises, forming an RSiOH radical where R represents an alkyl radical in which the oxygen is not saturated and may thus generate an oxide deposition rich in silanol groups (SiOH).

The reaction in plasma phase, involving tetraalkyl orthosilicate and hydrogen peroxide, makes it possible to obtain such a deposition and a silanol content sufficient to produce a viscous liquid layer.

The silanol radical is sensitive and an anneal enables the silanol groups present in the oxide to be virtually completely destroyed: during this anneal the silanol is converted into SiO, releasing hydrogen or water. The precursor material thus annealed is converted into silicon oxide $SiO_2$.

As gaseous silicon compounds, it is possible to use the tetraalkyl orthosilicate compounds usual in micro-electronics and, more particularly, the tetraalkyl orthosilicates containing alkyl groups, provided that the alkyl radical does not form a heavy condensable material. These may be methyl, ethyl or butyl groups.

The use of this technique allows suitable filling of cavities having small geometries or narrow cavities. Thus, the process according to the invention allows defect-free filling of narrow cavities; narrow cavities are understood to mean, especially, cavities having a width of about 0.4 µm and depths greater than 1 µm.

The subject of the invention is also an interconnection or semiconductor device comprising a conductive or semiconductor substrate, which has regions insulated by silicon oxide, characterized in that it includes at least one predetermined substrate region which is intended subsequently to form an active area and/or which comprises narrow cavities and in that the insulation comprises at least one first so-called conformal layer of oxide, a layer of oxide formed in the viscous state by reaction in plasma phase of a tetraalkylsilicate and of hydrogen peroxide and a second layer of oxide, the oxide formed in the viscous state lying between the first and second layers of oxide.

Other advantages and characteristics of the invention will appear on examining the detailed description of the modes of implementation and of the embodiments of the invention, these being in no way limiting, and of the appended drawings.

DESCRIPTION OF THE PREFERRED EMBODIMENT

Figure 1:
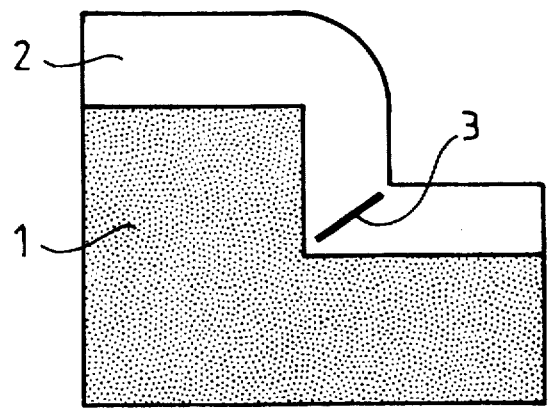
FIG. 1 illustrates the usual conformal SiO depositions.

As illustrated in FIG. 1, a layer of oxide 2 has been formed so as to be parallel to the surfaces of the substrate 1, on which surfaces it is deposited, and a density defect area 3 appears; this is a linear fault coincident with the bisector of the re-entrant angles.

Figure 2:
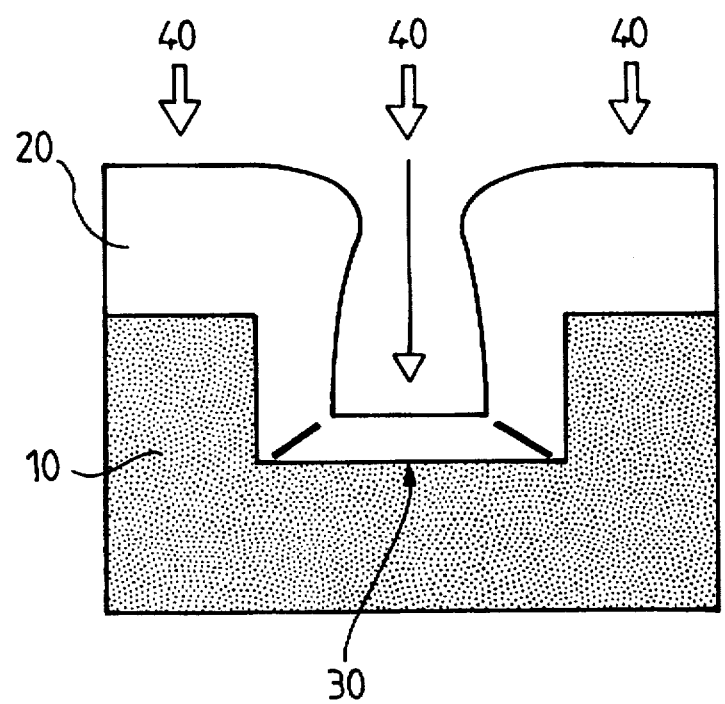
FIG. 2 illustrates the depletion, by shadowing effect, of the flux of SiO radicals during application of the flux of active species after a conformal deposition.

As appears in FIG. 2, during the usual application of a subsequent flux of active species after the conformal deposition 20 on a substrate 10 in a pattern having a small geometry 30, the flux 40 applied homogeneously to the surface is depleted on arriving at the bottom of the pattern 30 because of the shadowing effect caused by the conformal deposition 20.

Figure 3A:
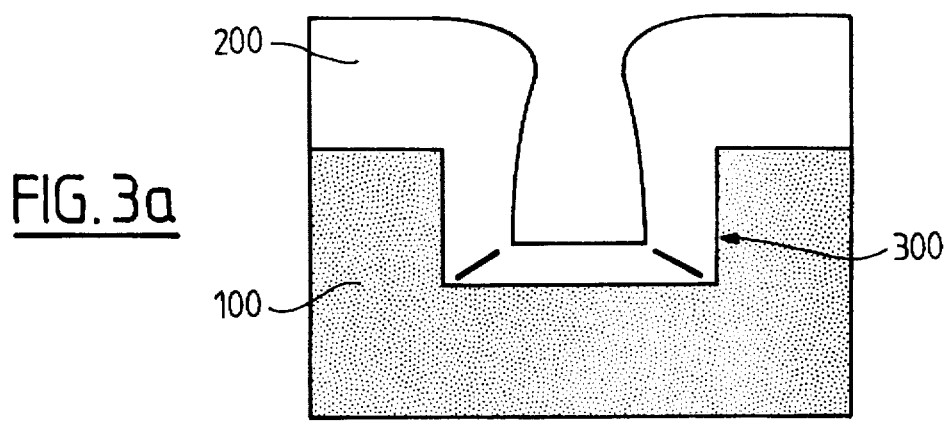
FIGS. 3a, 3b and 3c illustrate the implementation of the process according to the invention in a region of a substrate having a small geometry.
Figure 3B:
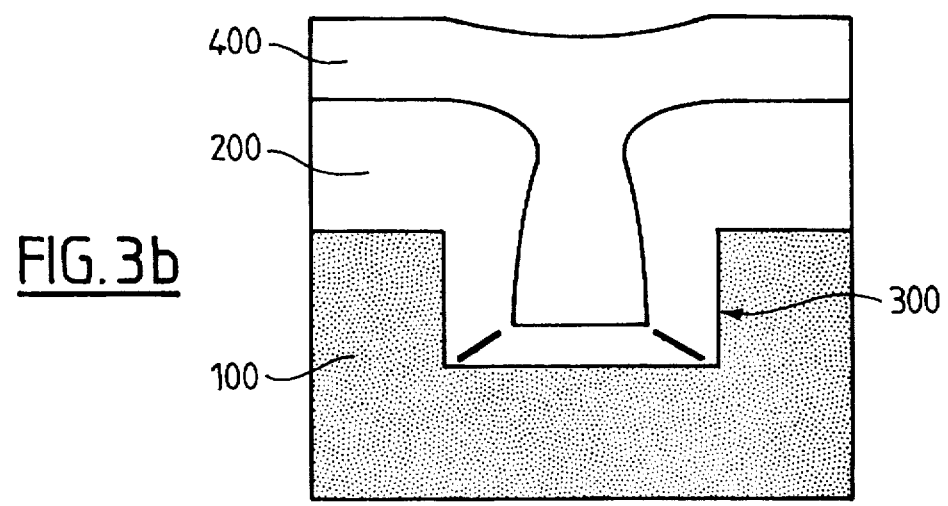
Figure 3C:
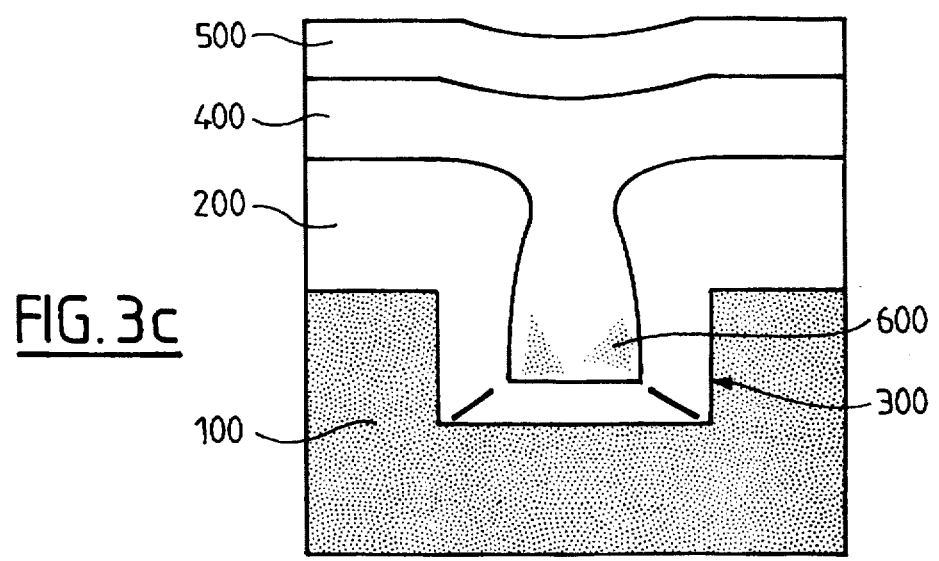

As illustrated in FIGS. 3a to 3c, the mode of implementation of the process according to the invention firstly comprises the usual deposition of a layer of oxide 200 on a substrate 100, a pattern of small geometry 300 of which is shown. The formation of this first layer 200 is produced by the usual deposition of silicon oxide, and one of its functions is to protect the substrate 100. The deposition of the first layer of oxide is conformal.

This conventional oxide deposition 200 is produced for the purpose especially of protecting the lower layers of the circuit during the conversion annealing operation in order to prevent the metals from being attacked.

As appears in FIG. 3b, a deposition is carried out in plasma phase on this first layer of oxide 200, the purpose of which deposition is to fill the narrow cavities by passing to the viscous state. The layer 400, because of its viscous state, fills the small-geometry cavity 300.

On this layer 400 deposited in plasma phase is conventionally deposited a layer of oxide 500 whose function is to encapsulate the viscous layer before annealing the assembly and to regulate the desorption of carbon monoxide, hydrogen and water, in order to prevent the formation of defects 600 and to slow down the decomposition of the silanol radical.

After the conversion annealing operation, the defects are localised in a wide area 600 appearing at the foot of the pattern.

Although the two steps (a) and (c) may be carried out conventionally, for example using CVD, the step of deposition of the layer of planarizing oxide in the viscous state takes place in plasma phase.

The CVD or plasma-phase deposition conditions are the usual ones in the micro-electronics field. It is preferred to operate under an inert gas, for example nitrogen, argon, or helium, in the usual manner.

It is possible to employ, for example, 1199 Pa (9 Torr) pressure conditions, a Radio Frecuence power of 50 watts, the use of gases via spargers at 40° C. and a flux of carrier gas, preferably inert gas, for example helium, of 200 sccm, it being possible to choose a 30% hydrogen peroxide solution.

The annealing operation is conducted under temperature conditions of between 300° C. and 1000° C.; the duration of the annealing operation depends on the temperature chosen. Thus, for a temperature of about 400° C., an annealing operation was carried out for approximately 30 minutes, the annealing operation taking place under nitrogen.

The planarizing layer resulting from the reaction in plasma phase may be identified using infrared analysis by the presence of the SiOH group (3360 and 940 $cm^{-1}$ wave-numbers).

Moreover, after annealing the layer of planarizing oxide, the density defects may be observed on the devices having insulated narrow cavities, by revealing them by immersion in a hydrofluoric acid solution.

Although in the case of conventional oxides the defects are localised to a linear fault coincident with the bisector of the re-entrant angles (see FIG. 1, area 3 and FIGS. 2 and 3 in the layer 20, 200), in the case of oxides deposited in viscous phase, these defects are less marked and they are localised in a wide area at the foot of the pattern (see FIG. 3c, area 600).

The process according to the invention may also replace the conventional planarizing processes, especially so-called SOG (spin on glass) processes. It may be used in conjunction with mechanochemical polishing.

I claim:

1. Process for making electrical insulation on conductive or semiconductive regions of a substrate comprising the steps of:
   (a) depositing at least one conformal layer of insulating oxide on regions of the substrate to be insulated;
   (b) chemically reacting in plasma phase a mixture consisting of a tetraalkylsilicate and hydrogen peroxide to deposit a layer of planarizing oxide precursor on the regions of the substrate covered with at least one conformal layer of insulating oxide;
   (c) depositing at least one layer of insulating oxide on the regions of the substrate covered with a layer of planarizing oxide precursor; and
   (d) conversion annealing the substrate.

2. Process according to claim 1, wherein the tetraalkylsilicate is tetraethyl orthosilicate.

3. Process according to claim 2, wherein the conversion annealing step is carried out at a temperature of between 300° C. and 1000° C.

4. Process according to claim 2, wherein the conversion annealing step is carried out at a temperature of about 400° C.

5. Process according to claim 2, wherein the deposited layer of planarizing oxide precursor is in a viscous state and encapsulates the conformal layer of insulating oxide.

6. Process according to claim 1, wherein the conversion annealing step is carried out at a temperature of between 300° C. and 1000° C.

7. Process according to claim 1, wherein the conversion annealing step is carried out at a temperature of about 400° C.

8. Process according to claim 1, wherein the deposited layer of planarizing oxide precursor is in a viscous state and encapsulates the conformal layer of insulating oxide.

9. Process according to claim 8, wherein the conversion annealing step is carried out at a temperature of between 300° C. and 1000° C.

10. Process according to claim 8, wherein the conversion annealing step is carried out at a temperature of about 400° C.

\* \* \* \* \*